(12) United States Patent
Mizunuma et al.

(10) Patent No.: US 11,081,804 B2
(45) Date of Patent: Aug. 3, 2021

(54) ANTENNA-INTEGRATED TYPE COMMUNICATION MODULE AND MANUFACTURING METHOD FOR THE SAME

(71) Applicant: Murata Manufacturing Co., Ltd., Kyoto (JP)

(72) Inventors: Ryuken Mizunuma, Kyoto (JP); Shinichiro Banba, Kyoto (JP); Michiharu Yokoyama, Kyoto (JP); Hideki Ueda, Kyoto (JP); Hideaki Yamada, Kyoto (JP); Noboru Morioka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 443 days.

(21) Appl. No.: 15/923,142

(22) Filed: Mar. 16, 2018

(65) Prior Publication Data

US 2018/0205155 A1 Jul. 19, 2018

Related U.S. Application Data

(63) Continuation of application No. PCT/JP2016/075695, filed on Sep. 1, 2016.

(30) Foreign Application Priority Data

Sep. 17, 2015 (JP) .............................. JP2015-183533

(51) Int. Cl.
*H01Q 1/38* (2006.01)
*H01Q 21/00* (2006.01)
(Continued)

(52) U.S. Cl.
CPC ......... *H01Q 21/0025* (2013.01); *H01L 23/66* (2013.01); *H01Q 1/2291* (2013.01);
(Continued)

(58) Field of Classification Search
CPC .... H01Q 21/0025; H01Q 1/2291; H01Q 1/38; H01Q 3/26; H01Q 3/2605;
(Continued)

(56) References Cited

U.S. PATENT DOCUMENTS

| | | | |
|---|---|---|---|
| 5,657,024 A | 8/1997 | Shingyoju et al. | |
| 2004/0212536 A1* | 10/2004 | Mori | H01Q 1/243 343/700 MS |

(Continued)

FOREIGN PATENT DOCUMENTS

| | | |
|---|---|---|
| CN | 1670999 A | 9/2005 |
| JP | H05-110325 A | 4/1993 |

(Continued)

OTHER PUBLICATIONS

Written Opinion for PCT/JP2016/075695 dated Nov. 15, 2016.
(Continued)

*Primary Examiner* — Dameon E Levi
*Assistant Examiner* — David E Lotter
(74) *Attorney, Agent, or Firm* — Pearne & Gordon LLP

(57) ABSTRACT

A multilayer substrate includes a first dielectric layer and a conductor pattern disposed in at least an interior of the first dielectric layer. A second dielectric layer formed of a different material from a material of the first dielectric layer is disposed on the multilayer substrate. At least one radiation element is formed on the second dielectric layer. A feeding wire connects the radiation element and the conductor pattern. The feeding wire includes a conductor pin that is conductive and extends in a thickness direction of the second dielectric layer. The conductor pin electrically connects the radiation element and the conductor pattern. Provided is an antenna-integrated type communication module having such a structure that the accuracy of circuit simula-
(Continued)

tion is easily enhanced and the degree of freedom in selection of dielectric materials is large.

19 Claims, 11 Drawing Sheets

(51) Int. Cl.
    *H01Q 3/26*     (2006.01)
    *H01Q 25/00*     (2006.01)
    *H04B 7/00*     (2006.01)
    *H01Q 23/00*     (2006.01)
    *H01Q 21/06*     (2006.01)
    *H01L 23/66*     (2006.01)
    *H01Q 1/22*     (2006.01)

(52) U.S. Cl.
    CPC ............... *H01Q 1/38* (2013.01); *H01Q 3/26* (2013.01); *H01Q 3/2605* (2013.01); *H01Q 21/0087* (2013.01); *H01Q 21/062* (2013.01); *H01Q 21/065* (2013.01); *H01Q 21/067* (2013.01); *H01Q 23/00* (2013.01); *H01Q 25/00* (2013.01); *H04B 7/00* (2013.01); *H01L 2223/6677* (2013.01); *H01L 2224/16227* (2013.01); *H01L 2924/1532* (2013.01); *H01L 2924/1533* (2013.01); *H01L 2924/15159* (2013.01)

(58) Field of Classification Search
    CPC ........... H01Q 121/0087; H01Q 21/062; H01Q 21/065; H01Q 21/067; H01Q 23/00; H01Q 25/00; H01L 23/66; H01L 2223/6677; H01L 2224/16227; H01L 2924/15159; H01L 2924/1532; H01L 2924/1533; H04B 7/00
    See application file for complete search history.

(56) References Cited

U.S. PATENT DOCUMENTS

| | | |
|---|---|---|
| 2006/0017616 A1 | 1/2006 | Hsu et al. |
| 2010/0164783 A1* | 7/2010 | Choudhury .............. H01Q 3/26 342/175 |
| 2013/0181874 A1 | 7/2013 | Park et al. |
| 2015/0070228 A1* | 3/2015 | Gu ....................... H01Q 1/2283 343/727 |

FOREIGN PATENT DOCUMENTS

| | | |
|---|---|---|
| JP | H08-114667 A | 5/1996 |
| JP | 2001-326319 A | 11/2001 |
| JP | 2004-260786 A | 9/2004 |
| JP | 2007-124201 A | 5/2007 |
| JP | 2012-514431 A | 6/2012 |
| JP | 2013-146064 A | 7/2013 |

OTHER PUBLICATIONS

International Search Report for PCT/JP2016/075695 dated Nov. 15, 2016.
Chinese Office action for 201680053959.9 dated Jun. 18, 2020.

* cited by examiner

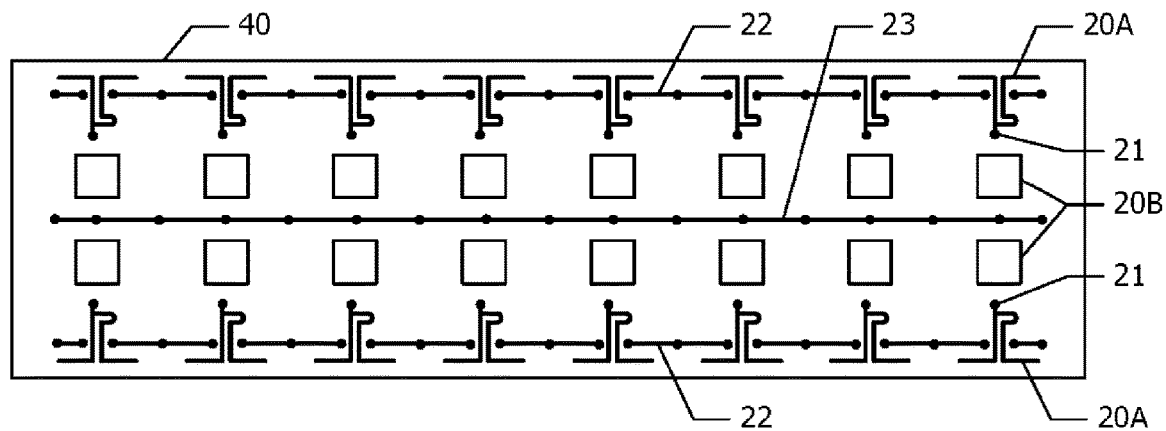
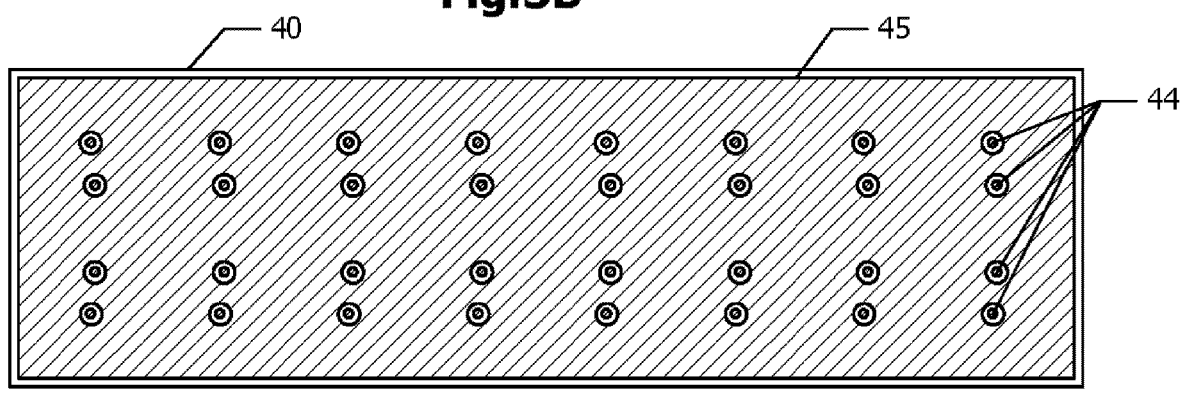
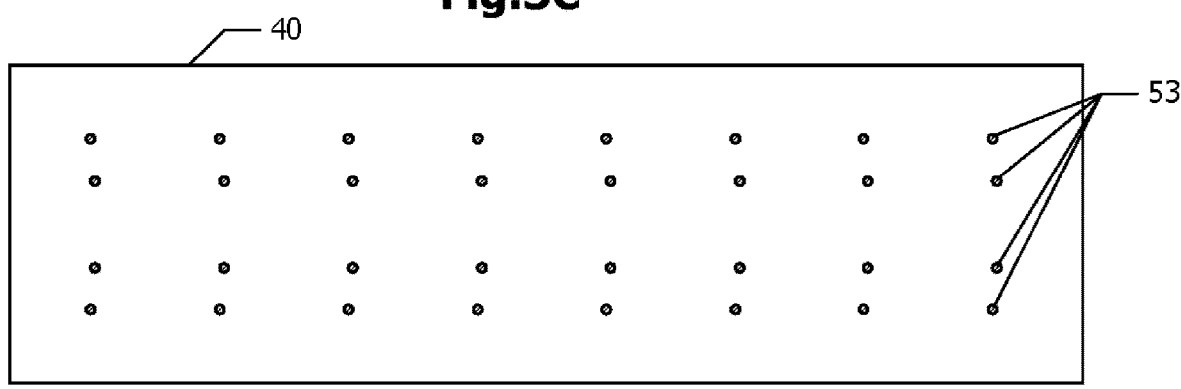

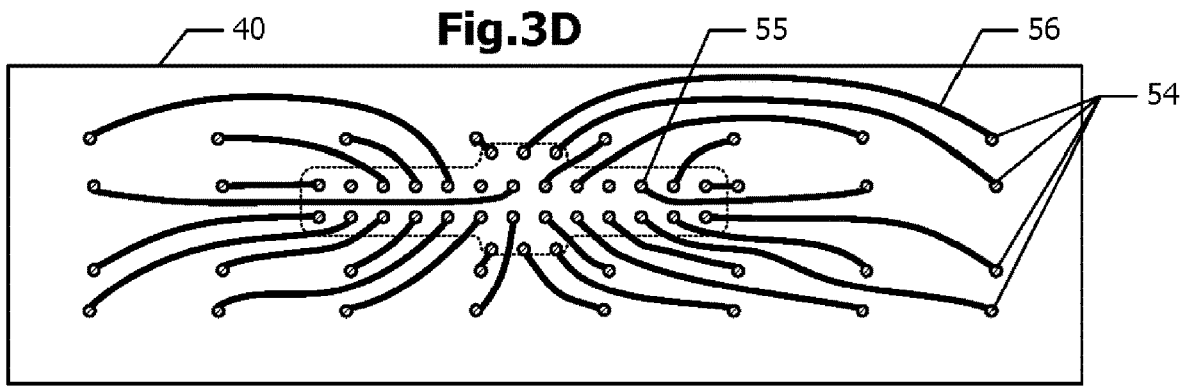
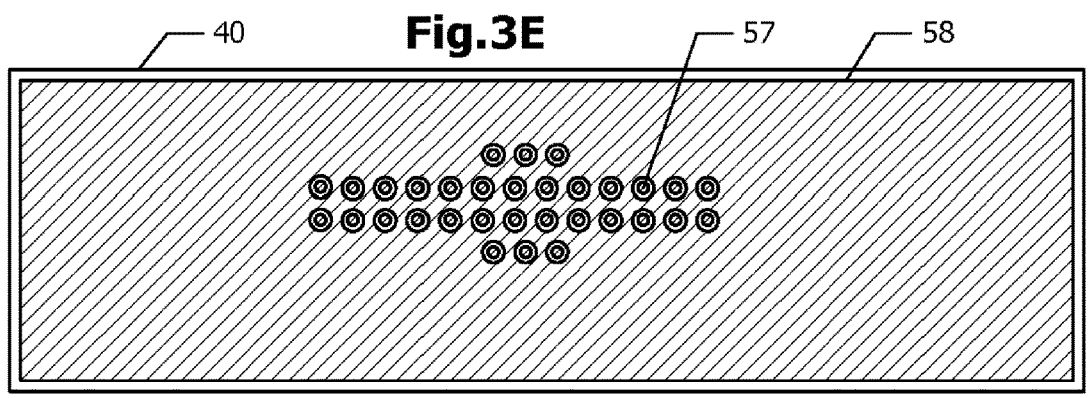
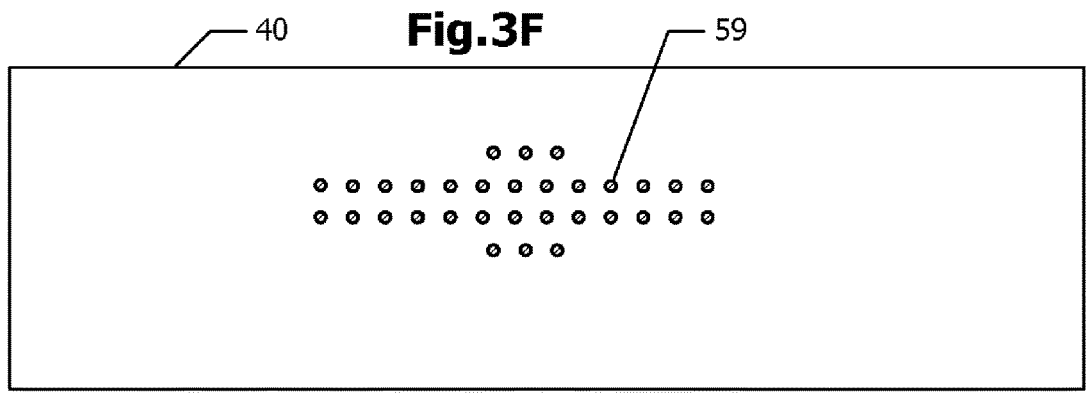
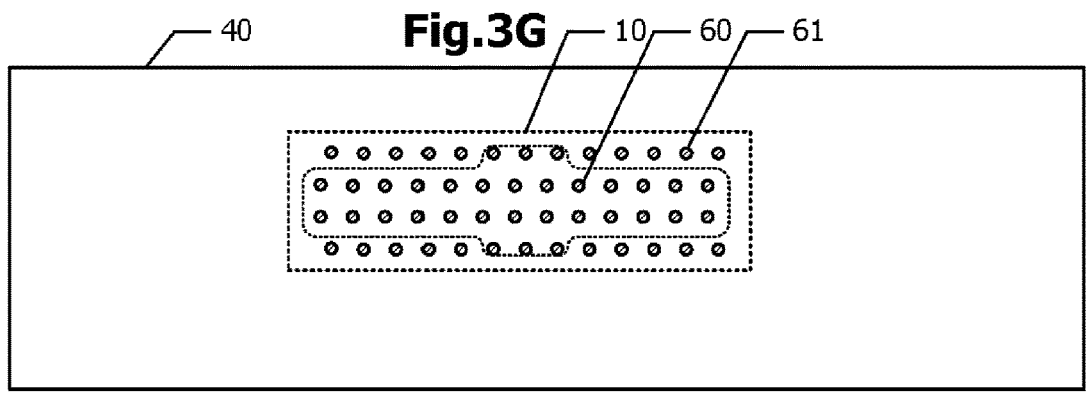

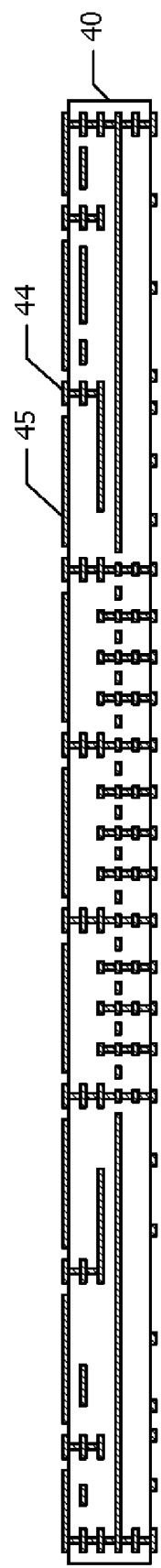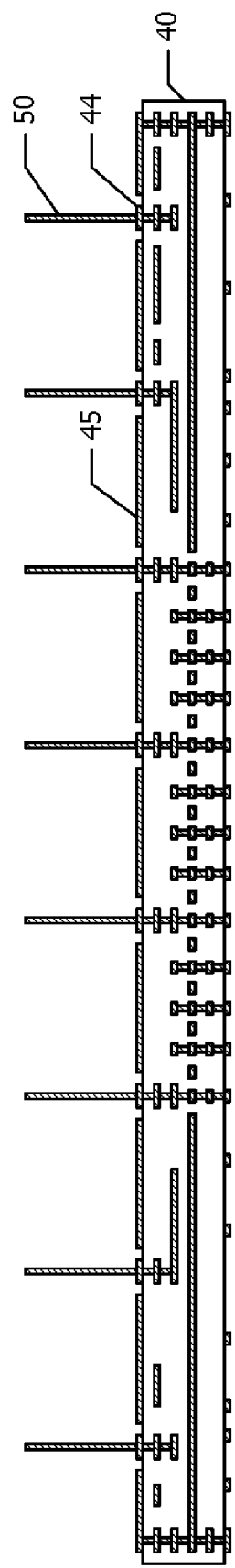

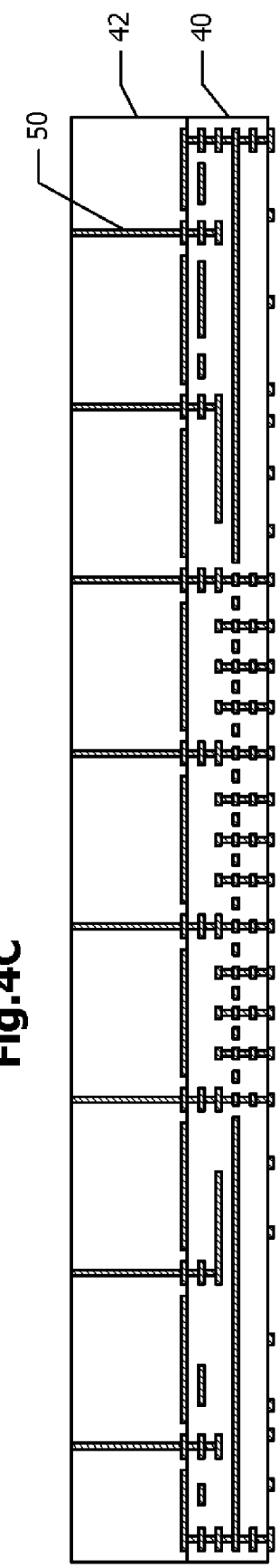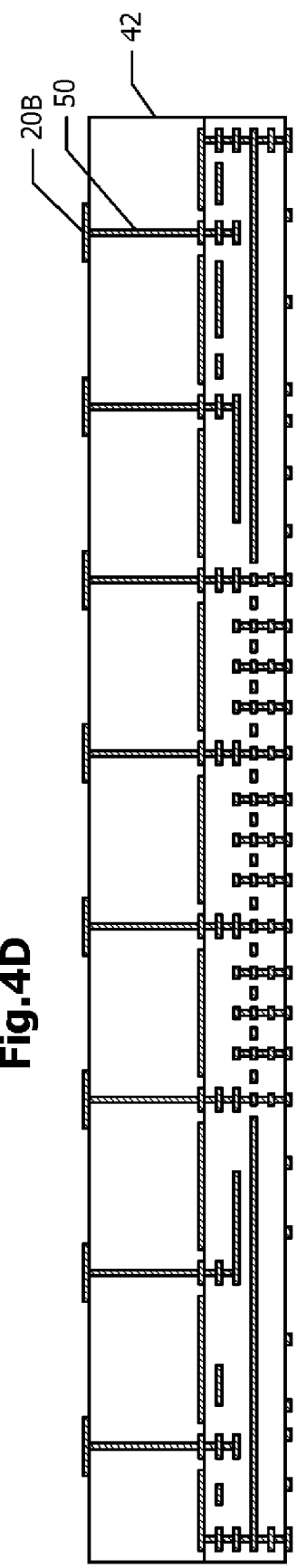

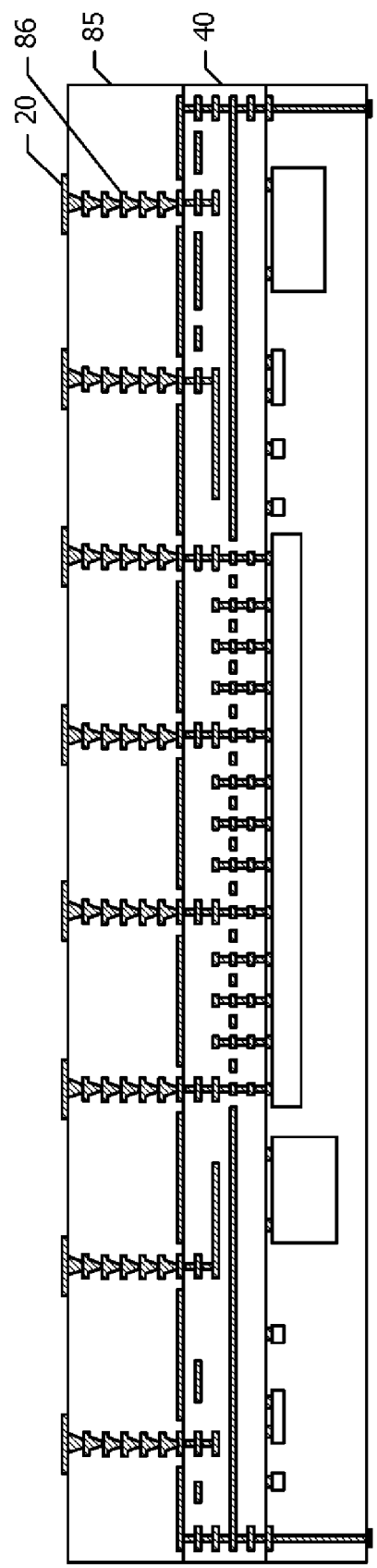

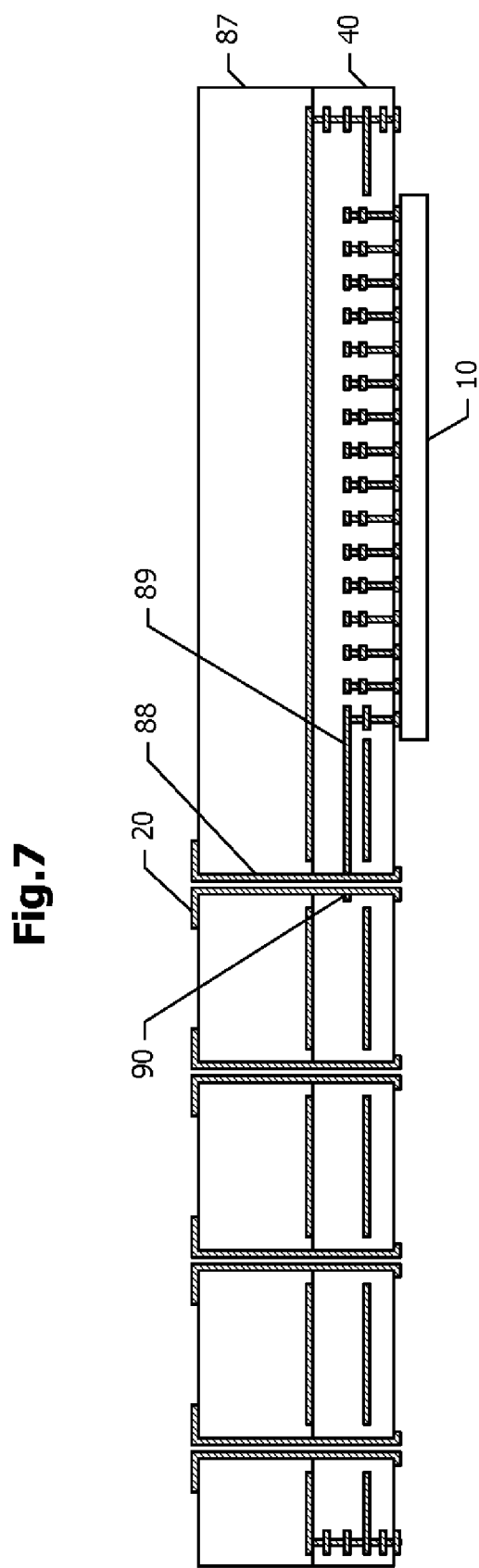

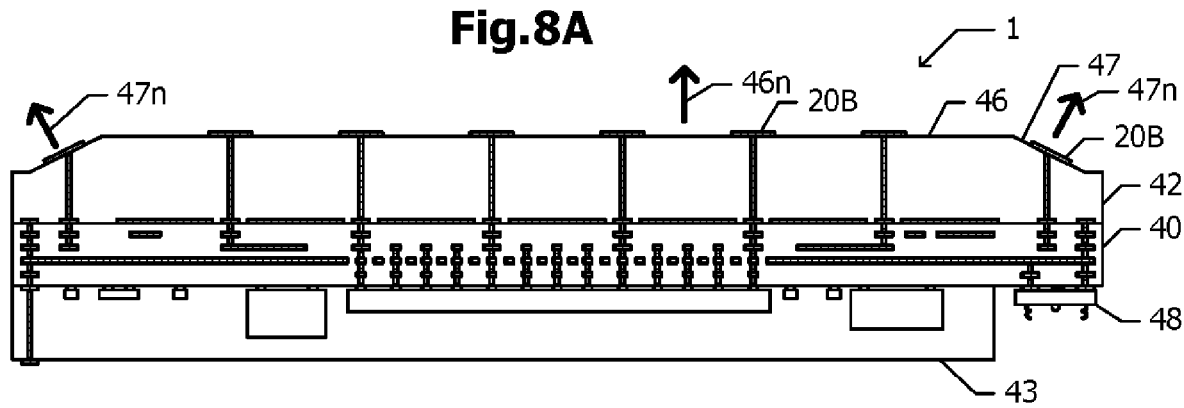
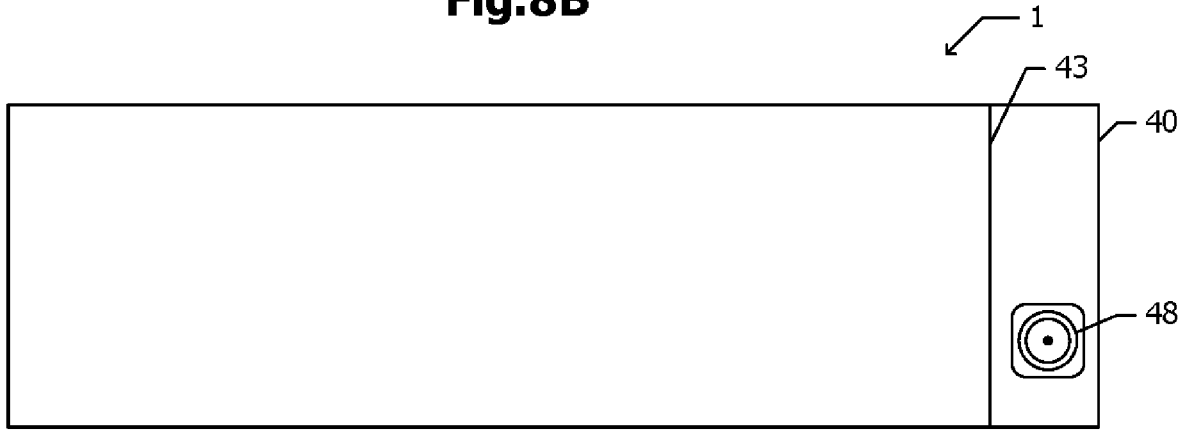

ANTENNA-INTEGRATED TYPE COMMUNICATION MODULE AND MANUFACTURING METHOD FOR THE SAME

This is a continuation of International Application No. PCT/JP2016/075695 filed on Sep. 1, 2016 which claims priority from Japanese Patent Application No. 2015-183533 filed on Sep. 17, 2015. The contents of these applications are incorporated herein by reference in their entireties.

BACKGROUND OF THE DISCLOSURE

Field of the Disclosure

The present disclosure relates to an antenna-integrated type communication module and its manufacturing method.

Description of the Related Art

An antenna-integrated type communication module in which a high frequency circuit module (a transmission/reception circuit component) and an antenna element (a patch antenna) are integrated is disclosed in Patent Document 1 cited below. In the disclosed antenna-integrated type communication module, a first conductor layer, a first dielectric layer, a second conductor layer, a second dielectric layer, and a third conductor layer are laminated in that order from above.

The patch antenna is disposed in the first conductor layer, a ground electrode is provided in the second conductor layer, and a plurality of pieces of wiring are provided in the third conductor layer. The transmission/reception circuit component is mounted on a lower surface of the second dielectric layer and the third conductor layer. A radiation element disposed in the first conductor layer and the wiring disposed in the third conductor layer are connected to each other through a through-hole passing through the first dielectric layer and the second dielectric layer. In order to optimize high frequency circuit characteristics, a thickness of the first dielectric layer is larger than a thickness of the second dielectric layer, and a dielectric constant of the first dielectric layer is lower than a dielectric constant of the second dielectric layer.

Patent Document 1 further discloses a configuration in which the transmission/reception circuit component is covered with a protection resin. Moreover, an array antenna in which a plurality of patch antennas are disposed is also disclosed.

Patent Document 1: Japanese Unexamined Patent Application Publication No. 2001-326319

BRIEF SUMMARY OF THE DISCLOSURE

Usage of higher frequencies has been accelerated in order to increase transmission speeds of wireless communications. Wireless LAN using a millimeter waveband is becoming popular even at home today. However, in the case of the millimeter waveband, the transmission loss becomes large because of the radio waves being reflected and absorbed by a shielding object such as a human body, furniture, or the like. Such large transmission loss makes it difficult to maintain a high communication speed.

A high communication speed can be achieved by using an adaptive array antenna including a large number of radiation elements. With a communication scheme using an adaptive array antenna, by controlling a phase and amplitude of each input-output signal of the large number of radiation elements, a transmission/reception path can be optimized by incorporating reflection from the ceiling, furniture, or the like. Of the adaptive array antennas, an antenna configured to control only a phase of each input-output signal of a large number of radiation elements is called a phased array antenna. The phased array antenna is widely used because the configuration thereof is simpler than that of the adaptive array antenna configured to control both a phase and amplitude.

In order to secure the characteristics of the adaptive array antenna, it is important to increase the number of radiation elements and the number of circuit systems for adjusting the phase and amplitude, and widen the directivity of each of the radiation elements. In the case of the millimeter waveband, loss at a discontinuous portion of characteristic impedance becomes large; the discontinuous portion is caused by a wiring pattern being curved, a through-hole, or the like. In order to suppress the increase in the loss, it is advisable to connect a transmission/reception circuit component and a feeding point of the radiation element in a short distance as much as possible, and it is also advisable to connect them smoothly (making the curvature of a curved portion of the wiring pattern be large).

In the configuration of the antenna module disclosed in Patent Document 1, a conductor for connecting the transmission/reception circuit component to the feeding point of the radiation element is disposed in a through-hole passing through the first dielectric layer and the second dielectric layer being laminated. The conductor in the through-hole and the transmission/reception circuit component are connected to each other via wiring disposed on the lower surface of the second dielectric layer.

With this structure, the wiring needs to be disposed separate from the through-hole. As the number of radiation elements increases, the number of through-holes increases. As such, by the wiring being distributed separate from the through-holes, the wiring becomes long in length. In addition, the transmission/reception circuit component needs to be disposed separate from the position of each of the through-holes and the periphery thereof. This makes it difficult to shorten the wiring and smooth the wiring pattern. As a result, the transmission loss becomes large. Further, with the configuration in which the wiring is long and the curvature of a curved portion of the wiring pattern is large, it is difficult to enhance the circuit simulation accuracy. This makes it difficult to design, by simulator, the structure of an antenna having optimum characteristics, so that a case in which desired characteristics cannot be obtained is likely to occur. The design needs to be modified if the desired characteristics cannot be obtained.

An object of the present disclosure is to provide an antenna-integrated type communication module and a manufacturing method for the communication module, in which a radiation element and a circuit component can be connected without providing a through-hole, for a feeding wire, extending from a surface where the radiation element is disposed to a surface where the circuit component is mounted.

An antenna-integrated type communication module according to a first aspect of the present disclosure includes:
a multilayer substrate including a first dielectric layer and a conductor pattern disposed in at least an interior of the first dielectric layer;
a second dielectric layer that is disposed on the multilayer substrate, and is formed of a different material from a material of the first dielectric layer;

at least one radiation element formed on the second dielectric layer; and a feeding wire connecting the radiation element and the conductor pattern, wherein the feeding wire includes a conductor pin that is conductive and extends in a thickness direction of the second dielectric layer, and the conductor pin electrically connects the radiation element and the conductor pattern.

It is unnecessary to provide, inside the multilayer substrate, a through-hole for a feeding wire because a bar-shaped conductor to become the feeding wire is connected to the conductor pattern disposed in or on the upper surface of the multilayer substrate. Accordingly, a wiring pattern can be disposed inside the multilayer substrate without the wiring pattern being separated from the position of the conductor pin and the position of the conductor pattern to which the conductor pin is connected. In addition, when a circuit component is mounted on a bottom surface of the multilayer substrate, it is unnecessary for the circuit component to be separate from the position of the conductor pin.

The antenna-integrated type communication module according to a second aspect of the present disclosure is such that, in addition to the configuration of the antenna-integrated type communication module according to the first aspect, a dielectric constant of the second dielectric layer is smaller than a dielectric constant of the first dielectric layer.

The antenna-integrated type communication module according to a third aspect of the present disclosure is such that, in addition to the configuration of the antenna-integrated type communication module according to the first or second aspect, a dielectric loss tangent of the second dielectric layer is smaller than a dielectric loss tangent of the first dielectric layer.

By using a material, as the second dielectric layer, which has a smaller dielectric loss tangent than the dielectric loss tangent of the first dielectric layer, electric energy loss becomes small inside the second dielectric layer, thereby making it possible to improve the antenna characteristics.

The antenna-integrated type communication module according to a fourth aspect of the present disclosure is such that, in addition to the configuration of the antenna-integrated type communication module according to any one of the first through third aspects, one end surface of the conductor pin makes contact with an upper surface of the conductor pattern.

In a configuration where the conductor pin extends down to a position lower than the conductor pattern disposed on the upper surface of the first dielectric layer, a portion of the conductor pin extending downward in that manner acts as an unexpected open end (open stub). With the configuration in which one end surface of the conductor pin opposes the conductor pattern disposed on the upper surface of the first dielectric layer, the portion extending downward is not produced. As a result, an unexpected open end is prevented from being produced.

The antenna-integrated type communication module according to a fifth aspect of the present disclosure is such that, in addition to the configuration of the antenna-integrated type communication module according to any one of the first through fourth aspects, a shape and an area of a cross section, orthogonal to a lengthwise direction, of the conductor pin are constant in the lengthwise direction.

By employing the above-discussed configuration, an increase in transmission loss of a high frequency signal propagating in the conductor pin can be suppressed.

The antenna-integrated type communication module according to a sixth aspect of the present disclosure is such that, in addition to the configuration of the antenna-integrated type communication module according to any one of the first through fifth aspects, the antenna-integrated type communication module includes the plurality of radiation elements, and the plurality of radiation elements configure an adaptive array antenna.

The employment of the above-discussed configuration makes it possible to optimize a transmission/reception path by incorporating reflection from the ceiling, furniture, or the like present in a space where radio waves radiated from the antenna propagate.

The antenna-integrated type communication module according to a seventh aspect of the present disclosure is such that, in addition to the configuration of the antenna-integrated type communication module according to the sixth aspect, an upper surface of the second dielectric layer includes a flat region and a slant region continuously connected to the flat region, the slant region is slanted in such a direction that a normal direction of the flat region and a normal direction of the slant region are distanced from each other as the normal directions leaving farther from the second dielectric layer, and the plurality of radiation elements each acting as a patch antenna are disposed in the flat region and the slant region.

The radiation element disposed in the slant region has strong directivity toward a lateral side. With this, the degree of freedom in directivity adjustment can be increased as an adaptive array antenna.

A manufacturing method for an antenna-integrated type communication module according to an eighth aspect of the present disclosure includes:

preparing a multilayer substrate that includes a first dielectric layer, a conductor pattern disposed at least inside the first dielectric layer, and a plurality of lands disposed on an upper surface of the first dielectric layer;

bonding conductor pins to be feeding wires onto the plurality of lands;

forming a second dielectric layer on the multilayer substrate in such a manner as to cover the conductor pins; and forming radiation elements, on the second dielectric layer, that are respectively connected to the plurality of conductor pins.

Because bar-shaped conductors to become the feeding wires are connected to the lands disposed on the upper surface of the multilayer substrate, a wiring pattern can be disposed inside the multilayer substrate without the wiring pattern being separated from the positions of the conductor pins, lands, and the like. In addition, when a transmission/reception circuit component is mounted on the bottom surface of the multilayer substrate, it is unnecessary for the circuit component to be separate from the positions of the conductor pins. Because the second dielectric layer is so formed on the multilayer substrate as to cover the conductor pins, it is possible to enhance the bonding strength between the multilayer substrate and the second dielectric layer in comparison with a case in which a dielectric substrate corresponding to the second dielectric layer is bonded to the multilayer substrate by soldering, or the like.

It is unnecessary to provide, inside the multilayer substrate, a through-hole for a feeding wire because a bar-shaped conductor to become the feeding wire is connected to the conductor pattern disposed in or on the multilayer substrate. Accordingly, a wiring pattern can be disposed inside the multilayer substrate without the wiring pattern being separated from the position of the conductor pin and the position of the conductor pattern to which the conductor pin is connected. In addition, when a circuit component is mounted on the bottom surface of the multilayer substrate, it is unnecessary for the circuit component to be separate from the position of the conductor pin.

BRIEF DESCRIPTION OF THE SEVERAL VIEWS OF THE DRAWINGS

FIG. 3A is a layout view of a conductor pattern disposed on an upper surface of a second dielectric layer; FIG. 3B and FIG. 3C are layout views of conductor patterns disposed in conductor layers respectively positioned as the first layer and the second layer when viewed from the upper side of a multilayer substrate.

FIG. 3D, FIG. 3E, FIG. 3F, and FIG. 3G are layout views of conductor patterns disposed in conductor layers respectively positioned as the third, fourth, fifth, and sixth layers when viewed from the upper side of the multilayer substrate.

Each of FIG. 4A and FIG. 4B is a cross-sectional view of the antenna-integrated type communication module according to the first embodiment in a midway stage of manufacturing.

Each of FIG. 4C and FIG. 4D is a cross-sectional view of the antenna-integrated type communication module according to the first embodiment in a midway stage of manufacturing.

FIG. 6 is a cross-sectional view of an antenna-integrated type communication module according to a second comparative example.

FIG. 7 is a cross-sectional view of an antenna-integrated type communication module according to a third comparative example.

FIG. 8A and FIG. 8B are respectively a cross-sectional view and a bottom view of an antenna-integrated type communication module according to a second embodiment.

DETAILED DESCRIPTION OF THE DISCLOSURE

First Embodiment

Figure 1:
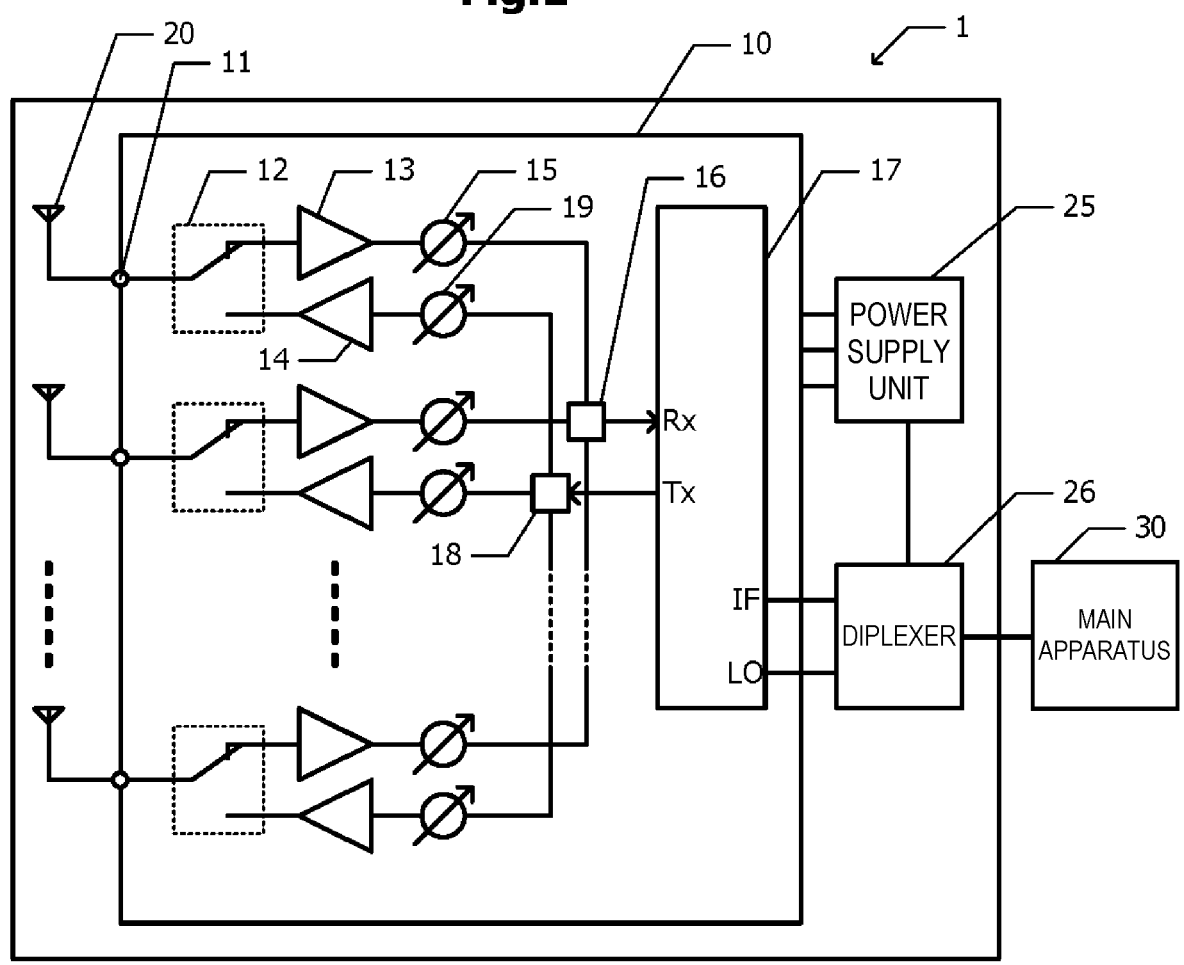
FIG. 1 is a block diagram of an antenna-integrated type communication module according to a first embodiment.

FIG. 1 illustrates a block diagram of an antenna-integrated type communication module 1 according to a first embodiment. The antenna-integrated type communication module 1 according to the first embodiment includes a phased array antenna of 32 elements configured to control only a phase, and is used in communications using millimeter waves of the 60 GHz band.

Radiation elements 20 of 32 pieces are each connected to an input-output terminal 11 of a transmission/reception circuit component 10. Each of the input-output terminals 11 is selectively connected to one of a reception low noise amplifier 13 and a transmission power amplifier 14 via a switch (transmission/reception switching device) 12. The radiation element 20 is normally connected to the reception low noise amplifier 13, and is connected to the transmission power amplifier 14 only at the time of transmission.

An output of the reception low noise amplifier 13 is inputted to a phase shifter 15 for reception. Outputs from the plurality of phase shifters 15 are collected by a combiner (signal combining device) 16 and inputted to a reception portion of a frequency converter 17. With this configuration, reception signals received by the plurality of radiation elements 20 are subject to phase adjustment and are combined, and thereafter inputted to the reception portion of the frequency converter 17.

A transmission signal from a transmission portion of the frequency converter 17 is inputted to a plurality of phase shifters 19 for transmission through splitters (signal splitting devices) 18. Outputs of the plurality of phase shifters 19 are each connected to the transmission power amplifier 14. With this configuration, the transmission signal is distributed to the plurality of phase shifters 19 by the splitter 18 and subject to phase adjustment, and thereafter the phase-adjusted signal is amplified and radiated from the radiation element 20.

The switch 12, the reception low noise amplifier 13, the transmission power amplifier 14, the phase shifters 15 and 19, the combiner 16, the splitter 18, and the frequency converter 17 are configured by, for example, a one-chip integrated circuit component.

The antenna-integrated type communication module 1 further includes a power supply unit 25 and a diplexer 26. The antenna-integrated type communication module 1 is incorporated into a main apparatus 30 such as a computer, a smartphone, or the like. A power supply and a local oscillation signal LO are supplied to the diplexer 26 from the main apparatus 30. Further, at the time of transmission, an intermediate frequency signal IF is supplied to the diplexer 26 from the main apparatus 30.

The power supply unit 25 generates a power-supply voltage, for operation of the transmission/reception circuit component 10, from the power supply and the signal supplied from the main apparatus 30. The diplexer 26 isolates the local oscillation signal LO, for operation of the frequency converter 17, from the signal supplied by the main apparatus 30, and then supplies the isolated signal to the frequency converter 17. Further, the diplexer 26 isolates or combines the intermediate frequency signal IF.

Figure 2A:
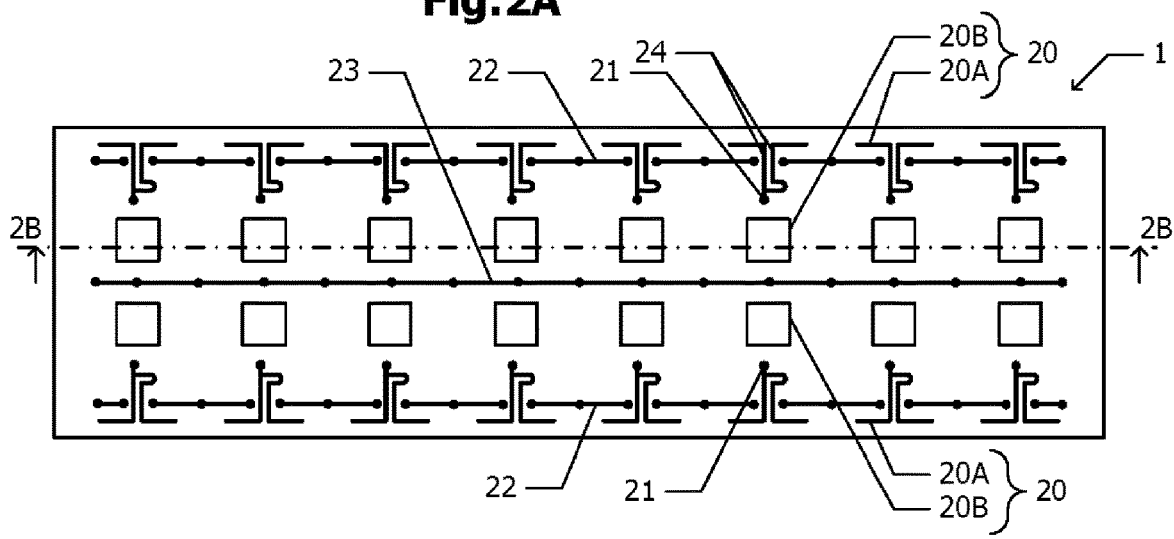
FIG. 2A, FIG. 2B, and FIG. 2C are respectively a plan view, a cross-sectional view, and a bottom view of the antenna-integrated type communication module according to the first embodiment.

FIG. 2A illustrates a plan view of the antenna-integrated type communication module 1 according to the first embodiment. On an upper surface of a substrate, as an example, the radiation elements 20 of 32 pieces are arranged in a matrix form including four rows and eight columns. For the radiation elements 20 in the first and fourth rows, printed dipole antennas 20A having directivity toward a lateral side of the substrate (upward and downward directions in FIG. 2A) are used and function as an end-fire antenna. For the radiation elements 20 in the second and third rows, patch antennas 20B having directivity in a normal direction of the substrate are used.

A feeding wire 24 extends from the printed dipole antenna 20A toward a rear side (an inner side of the substrate) to reach a connection point 21 through a balun (Balance-unbalance converter). The connection point 21 is connected to a wiring pattern in an inner layer via the feeding wire. On the rear side of the printed dipole antenna 20A, ground wiring 22 that is formed to be linear and extends in a row direction is disposed. Ground wiring 23 extending in the row direction is disposed between the patch antenna 20B in the second row and the patch antenna 20B in the third row. The ground wiring 22 and the ground wiring 23 each have a function to adjust the antenna characteristics and secure isolation between the antennas.

Figure 2B:
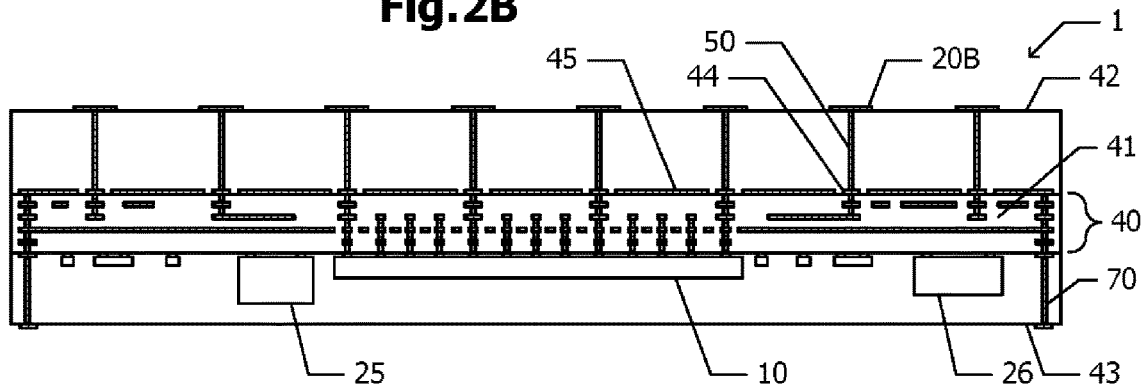

FIG. 2B illustrates a cross-sectional view taken along a dot-dash line 2B-2B in FIG. 2A. A multilayer substrate 40 includes a first dielectric layer 41 and a conductor pattern. The conductor pattern is disposed on an upper surface, in an interior, and on a lower surface of the first dielectric layer 41. The conductor pattern disposed on the upper surface of the first dielectric layer 41 includes a ground conductor 45 and a plurality of lands 44. The lands 44 are disposed corresponding to the radiation elements 20 (see FIG. 2A). A Low Temperature Co-fired Ceramics (LTCC) substrate, a printed circuit substrate, or the like can be used for the multilayer substrate 40, for example.

A second dielectric layer 42 is laminated on the multilayer substrate 40. The ground conductor 45 and the lands 44 are disposed on a boundary surface between the first dielectric layer 41 and the second dielectric layer 42, and make close contact with the second dielectric layer 42. The radiation elements 20 (see FIG. 2A) are disposed on an upper surface of the second dielectric layer 42. Of the plurality of radiation elements 20, the patch antennas 20B appear in the cross section illustrated in FIG. 2B.

A bar-shaped member (conductor pin) 50 that is conductive and extends in the thickness direction is buried in the second dielectric layer 42. One end portion (an upper end) of the bar-shaped member 50 is connected to the radiation element 20, and the other end portion (a lower end) thereof is connected to the land 44. The ground conductor 45 disposed on the upper surface of the first dielectric layer 41 acts as a ground layer (an electric wall) corresponding to the patch antenna 20B. Each of the ground wiring 22 and the ground wiring 23 (see FIG. 2A) is connected to the ground conductor 45 via another bar-shaped member 50 (not illustrated in the cross section of FIG. 2B) that is not connected to the radiation element 20.

A plurality of circuit components are mounted on a lower surface of the multilayer substrate 40. The circuit components include the transmission/reception circuit component 10, the power supply unit 25, the diplexer 26, and the like. The circuit components such as the transmission/reception circuit component 10, the power supply unit 25, the diplexer 26, and the like are covered with a third dielectric layer 43. The transmission/reception circuit component 10 is connected to the radiation element 20 with the conductor pattern inside the multilayer substrate 40, the land 44, and the bar-shaped member 50 interposed therebetween. There is no through-hole that passes from the surface where the radiation element 20 is disposed through the surface where the transmission/reception circuit component 10 is mounted.

A bar-shaped member 70 that is conductive and extends in the thickness direction is buried in the third dielectric layer 43. One end portion (an upper end) of the bar-shaped member 70 is connected to the conductor pattern disposed on the lower surface of the multilayer substrate 40, and the other end portion (a lower end) thereof is exposed to a surface of the third dielectric layer 43.

Figure 2C:
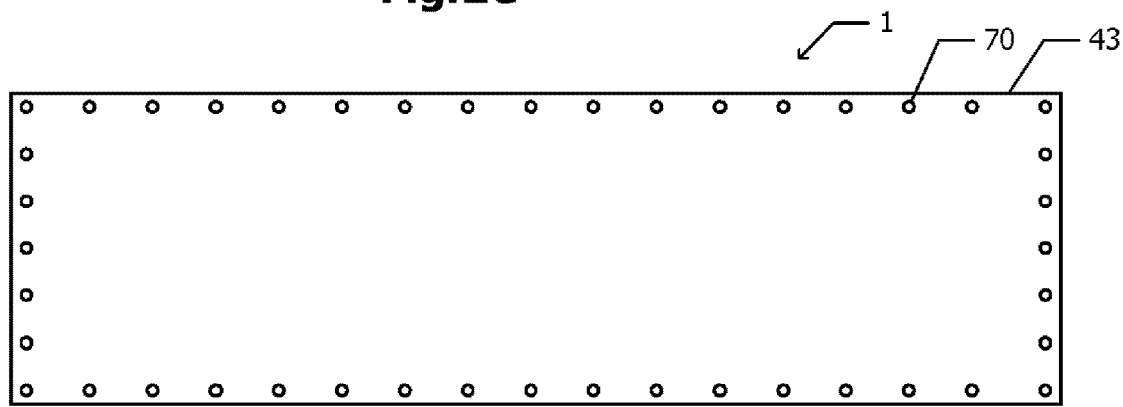

FIG. 2C illustrates a bottom view of the antenna-integrated type communication module 1. Lower ends of the plurality of bar-shaped members 70 are exposed to the bottom surface of the third dielectric layer 43. The plurality of bar-shaped members 70 are arranged along an outer perimeter line of the third dielectric layer 43 on a slightly inner side relative to the outer perimeter line of the third dielectric layer 43. The exposed lower ends of the bar-shaped members 70 are used as external connection terminals to be connected to the main apparatus 30 (see FIG. 1). For example, the antenna-integrated type communication module 1 is surface-mounted on a mother board of the main apparatus 30 with solder balls or the like placed on the external connection terminals.

FIG. 3A illustrates a layout view of the conductor pattern disposed on the upper surface of the second dielectric layer 42. FIG. 3B to FIG. 3G illustrate layout views of the conductor patterns disposed on the upper surface, in the interior, and on the lower surface of the multilayer substrate 40 (see FIG. 2B). FIG. 3A is the same view as that illustrated in FIG. 2A.

FIGS. 3B, 3C, 3D, 3E, 3F, and 3G illustrate the conductor patterns disposed in the conductor layers respectively positioned as the first, second, third, fourth, fifth, and sixth layers when viewed from above. In the fifth and sixth conductor layers, the wiring of the power supply, local oscillation signal LO, intermediate frequency signal IF, control signal, and the like is disposed. However, in FIGS. 3F and 3G, the wiring is not illustrated, and only the conductor pattern associated with the antenna and the land pattern connected to the transmission/reception circuit component 10 are illustrated.

The connection points 21 of the plurality of printed dipole antennas 20A (see FIG. 3A) and the feeding points of the plurality of patch antennas 20B (see FIG. 3A) are each connected to a conductor pattern 54 (see FIG. 3D) in the third conductor layer, via the land (conductor pattern) 44 in the first conductor layer disposed immediately thereunder (see FIG. 3B), and via a conductor pattern 53 (see FIG. 3C) in the second conductor layer.

A plurality of lands 60 and 61 (see FIG. 3G) to be connected to the transmission/reception circuit component 10 (see FIG. 2B) are disposed in the sixth layer of the multilayer substrate 40. The plurality of lands 60 are lands for connecting the transmission/reception circuit component 10 to the radiation elements 20, and the plurality of lands 61 are lands for connecting the transmission/reception circuit component 10 to the ground conductor and the wiring patterns of the power supply, local oscillation signal LO, intermediate frequency signal IF, control signal, and the like. Each of the plurality of lands 60 is connected to a conductor pattern 55 disposed in the third conductor layer, via a conductor pattern 59 (see FIG. 3F) in the fifth conductor layer disposed immediately above the land 60, and via a conductor pattern 57 (see FIG. 3E) in the fourth conductor layer.

In the third conductor layer, a plurality of wiring patterns 56 (see FIG. 3D) connect the conductor pattern 55 connected to the transmission/reception circuit component 10 (see FIG. 3G) and a conductor pattern 54 connected to the radiation element 20 (see FIG. 3A).

The ground conductor 45 (see FIG. 3B) is disposed in the first conductor layer. The ground conductor 45 is disposed across the substantially overall region except areas where the lands 44 are disposed. The ground wiring 22 and the ground wiring 23 (see FIG. 3A) disposed on the upper surface of the second dielectric layer 42 are connected to the ground conductor 45 disposed in the first conductor layer.

A ground conductor 58 is disposed in the fourth conductor layer. The ground conductor 58 is disposed substantially across the overall region except areas where the conductor patterns 57 are disposed. The ground conductor 58 is connected to the ground conductor 45 (see FIG. 3B) above the ground conductor 58. Although a conductor pattern to connect the ground conductors 45 and 58 is disposed in the second and third conductor layers, the conductor pattern is not illustrated in FIGS. 3C and 3D. The ground conductor 58 is connected to the bar-shaped member 70 (see FIG. 2B) via a conductor pattern disposed in the fifth and sixth conductor layers.

Next, a manufacturing method for the antenna-integrated type communication module 1 according to the first embodiment will be described with reference to FIG. 4A to FIG. 4F.

The multilayer substrate 40 as illustrated in FIG. 4A is prepared. The plurality of lands 44 and the ground conductor 45 are disposed on the upper surface of the multilayer substrate 40. An LTCC substrate, a printed circuit substrate, or the like can be used for the multilayer substrate 40.

As illustrated in FIG. 4B, the bar-shaped member 50 is bonded to each of the plurality of lands 44. Further, bar-shaped members for connecting the ground wiring 22 and the ground wiring 23 (see FIG. 2A) to the ground conductor 45 are bonded to predetermined positions in the ground conductor 45. For determining a position of the bar-shaped member 50, an electronic component mounting device (mounter), for example, can be used. As a bonding method, soldering, brazing, spot welding, or the like can be used. A lower end of the bar-shaped member 50 may be inserted into a surface layer portion of the multilayer substrate 40. The bar-shaped member 50 is formed in a circular cylinder shape, for example, and is fixed with a posture substantially perpendicular to the upper surface of the multilayer substrate 40. An end surface on the lower side of the bar-shaped member 50 opposes the land 44.

As illustrated in FIG. 4C, the second dielectric layer 42 covers the upper surface of the multilayer substrate 40 and the bar-shaped member 50. The second dielectric layer 42 is formed by, for example, applying a liquid dielectric material on the upper surface of the multilayer substrate 40 and thereafter curing the applied material. After the dielectric material being cured, an upper surface thereof and the bar-shaped member 50 are polished together to be flattened. With this, the second dielectric layer 42 is adjusted to have a target thickness and the upper end of bar-shaped member 50 is exposed to the upper surface of the second dielectric layer 42. For the second dielectric layer 42, it is preferable to use a dielectric material with a small dielectric loss tangent and a small variation in characteristics in the 60 GHz band, which is an operating frequency of the antenna.

As illustrated in FIG. 4D, the radiation elements 20 (see FIG. 2A) are formed on the flattened upper surface of the second dielectric layer 42. Of the plurality of radiation elements 20, the patch antennas 20B appear in FIG. 4D. At the same time, the printed dipole antennas 20A and the ground wiring 22, 23 are also formed. The radiation elements 20 and the like are formed by disposing a metal film on the upper surface of the second dielectric layer 42 and thereafter carrying out patterning, for example. The radiation element 20 is electrically connected to the bar-shaped member 50 because the upper surface of the second dielectric layer 42 is flattened and the upper end of the bar-shaped member 50 is exposed.

Figure 4E:
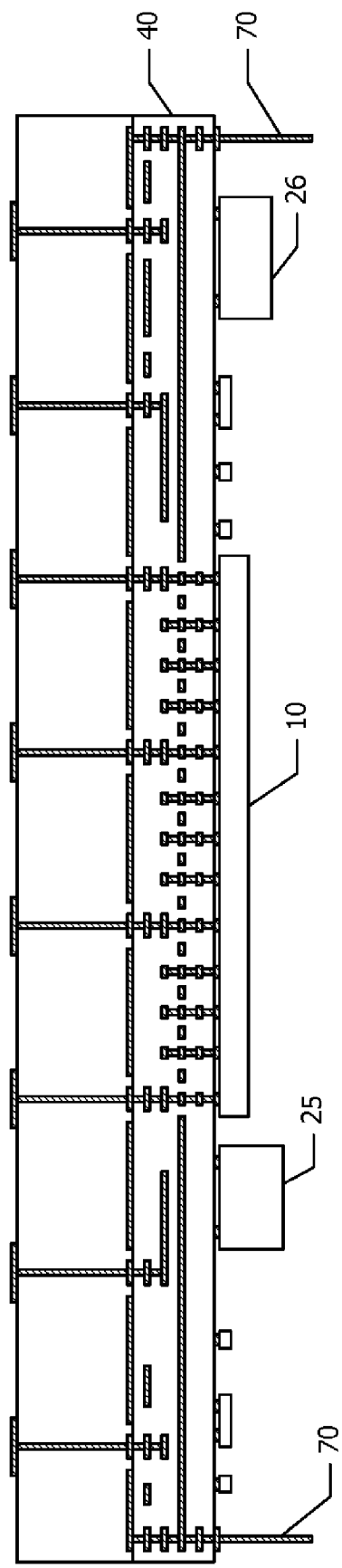
FIG. 4E is a cross-sectional view of the antenna-integrated type communication module according to the first embodiment in a midway stage of manufacturing.

As illustrated in FIG. 4E, the circuit components such as the transmission/reception circuit component 10, the power supply unit 25, the diplexer 26, and the like are mounted on the lower surface of the multilayer substrate 40. In addition, the bar-shaped members 70 are bonded to a circuit pattern of the lower surface (the sixth layer).

Figure 4F:
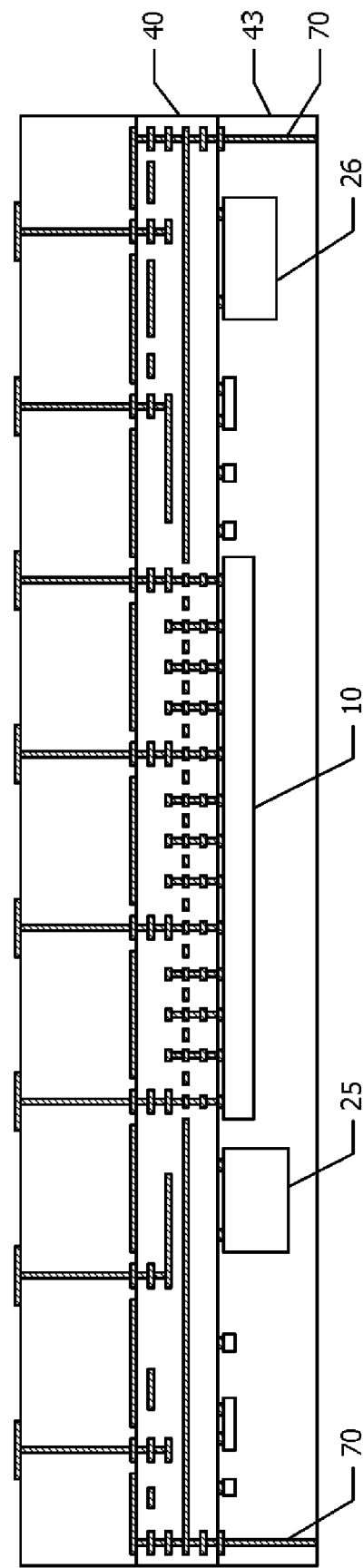
FIG. 4F is a cross-sectional view of the antenna-integrated type communication module according to the first embodiment.

As illustrated in FIG. 4F, the lower surface of the multilayer substrate 40, the circuit components mounted on the lower surface, and the bar-shaped members 70 are covered with the third dielectric layer 43. The third dielectric layer 43 can be formed with the same method as the second dielectric layer 42. The surface of the third dielectric layer 43 is polished to be flattened. This makes it possible to adjust the overall thickness of the antenna-integrated type communication module 1.

Each of FIGS. 4A to 4F illustrates a cross-sectional view of a single antenna-integrated type communication module 1 in a midway stage of manufacturing. In reality, a plurality of antenna-integrated type communication modules 1 are formed on a collective board, and thereafter the collective board is divided into individual antenna-integrated type communication modules 1, whereby each individual antenna-integrated type communication module 1 is manufactured. The side surfaces of the multilayer substrate 40 and the third dielectric layer 43 (see FIG. 4F) may be covered with a shield film.

Next, excellent effects of the antenna-integrated type communication module 1 according to the first embodiment will be described in comparison with some comparative examples.

Figure 5A:
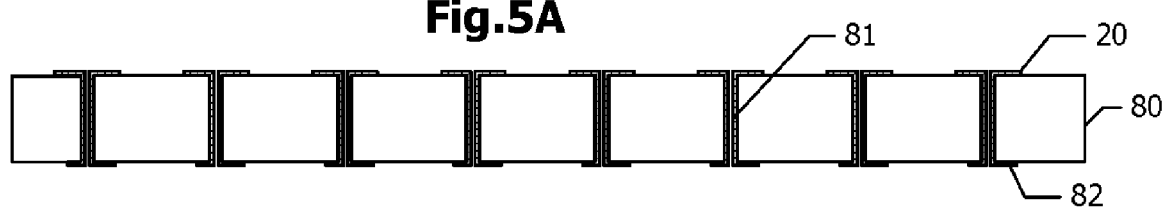
FIG. 5A is a cross-sectional view of an antenna substrate of an antenna-integrated type communication module according to a first comparative example.
Figure 5B:
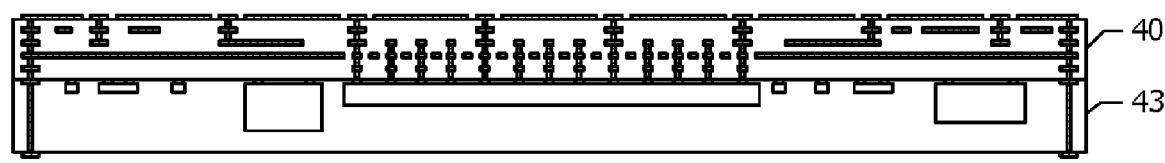
FIG. 5B is a cross-sectional view of a multilayer substrate and a third dielectric layer of the antenna-integrated type communication module according to the first comparative example.
Figure 5C:
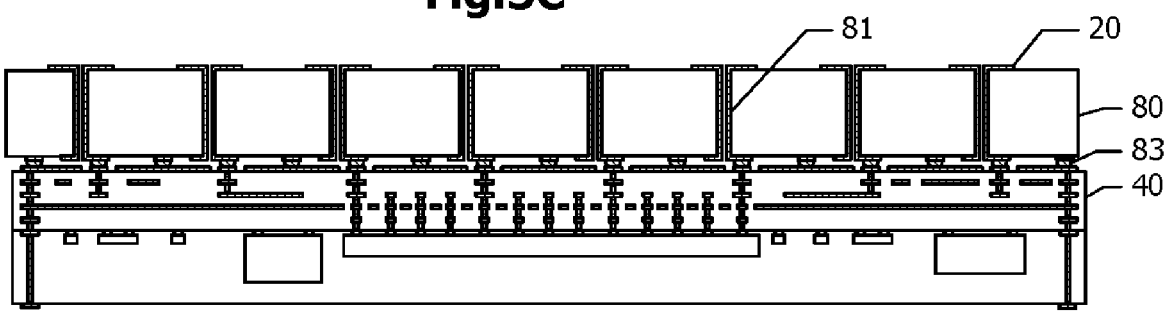
FIG. 5C is a cross-sectional view of the antenna-integrated type communication module according to the first comparative example.

Each of FIG. 5A to FIG. 5C illustrates a cross-sectional view of an antenna-integrated type communication module according to a first comparative example.

FIG. 5A is a cross-sectional view of an antenna substrate 80. The plurality of radiation elements 20 are disposed on an upper surface of the antenna substrate 80, and a land 82 is disposed on a lower surface thereof. The radiation element 20 and the land 82 are connected via a through-hole 81 passing through the antenna substrate 80.

FIG. 5B is a cross-sectional view of the multilayer substrate 40, on which electronic circuit components are mounted, and the third dielectric layer 43. The configuration of the multilayer substrate 40 and the third dielectric layer 43 is the same as that of the multilayer substrate 40 and the third dielectric layer 43 (see FIG. 2B) of the antenna-integrated type communication module according to the first embodiment.

As illustrated in FIG. 5C, the antenna substrate 80 and the multilayer substrate 40 are bonded to each other with solder 83 interposed therebetween. The radiation element 20 is connected to a conductor pattern of the multilayer substrate 40 via a conductor in the through-hole 81.

In the first comparative example, the antenna substrate 80 and the multilayer substrate 40 are separately manufactured, and then bonded to each other using solder. A preferable dielectric material, from the standpoint of obtaining preferable antenna characteristics, is used for the antenna substrate 80. As such, the antenna substrate 80 and the multilayer substrate 40 are formed with different dielectric materials from each other. As a result, thermal stress that can be generated in a bonding portion of the two substrates is undesirably concentrated on a bonding portion having a relatively small cross section. The concentration of the thermal stress lowers reliability of the bonding.

In the first embodiment, as illustrated in FIG. 4C, the second dielectric layer 42 is formed by applying a liquid dielectric material on the multilayer substrate 40. With this, the second dielectric layer 42 makes close contact with the multilayer substrate 40. The structure of the first embodiment can secure higher reliability than the structure of the first comparative example illustrated in FIG. 5C from the standpoint of mechanical strength.

In the first comparative example, the radiation element 20 is connected to the conductor pattern of the multilayer substrate 40 via the solder and the through-hole. In contrast, in the first embodiment, the radiation element 20 is connected to the conductor pattern of the multilayer substrate 40 via the bar-shaped member 50 (see FIG. 2B). In this manner, a geometric shape of the connection structure of the first embodiment is simpler than a geometric shape of the connection structure of the first comparative example. Because of this, the transmission loss can be reduced by employing the structure of the first embodiment. In addition, since the geometric shape is simple, accuracy of electromagnetic field simulation can be enhanced. This makes it easy to optimize the design using simulation.

FIG. 6 illustrates a cross-sectional view of an antenna-integrated type communication module according to a second comparative example. In the second comparative example, an antenna support dielectric layer 85 is laminated on the multilayer substrate 40 using a buildup technique. In the buildup technique, a filled via 86 is formed for each layer being laminated. The radiation element 20 is connected to the conductor pattern of the multilayer substrate 40 through the multistage filled vias 86.

In the second comparative example, a dielectric material suited to the buildup technique must be used for the antenna support dielectric layer 85. This lowers the degree of freedom in material selection. In addition, the transmission loss becomes large because a cross-sectional area of the multistage filled vias 86 varies in the thickness direction.

In the first embodiment, since the buildup technique is not applied to the formation of the second dielectric layer (see FIG. 2B), the degree of freedom in material selection is not lowered. As such, a dielectric material with a small dielectric loss tangent and a small variation in characteristics is used in the 60 GHz band, which is an operating frequency of the antenna. In the first embodiment, it is preferable to use a material, as a dielectric material of the second dielectric layer 42, having a smaller dielectric constant than the first dielectric layer 41 of the multilayer substrate 40. Further, as the dielectric material of the second dielectric layer 42, it is preferable to use a material having a smaller dielectric loss tangent than the first dielectric layer 41 of the multilayer substrate 40.

In the first embodiment, each of the bar-shaped members 50 (see FIG. 2B) is constituted of a single body from the lower end to the upper end thereof. In addition, a shape and an area of a cross section, orthogonal to the lengthwise direction, of the bar-shaped member 50 (see FIG. 2B) are constant in the lengthwise direction. This makes it possible to suppress the increase in transmission loss.

FIG. 7 illustrates a cross-sectional view of an antenna-integrated type communication module according to a third comparative example. In the third comparative example, an antenna support dielectric layer 87 is laminated on the multilayer substrate 40. The radiation element 20 is disposed on an upper surface of the antenna support dielectric layer 87. A through-hole 88 passing through the multilayer substrate 40 and the antenna support dielectric layer 87 is formed. A conductor in the through-hole 88 is connected to the radiation element 20 and functions as a feeding wire.

The transmission/reception circuit component 10 is connected to the conductor in the through-hole 88 via a conductor pattern 89 disposed inside the multilayer substrate 40. The conductor in the through-hole 88 extends upward from a connection portion 90 toward the radiation element 20, and also extends in the opposite direction (downward). Of the conductor in the through-hole 88, a section extending downward from the connection portion 90 acts as an open stub connected to a transmission line. In addition, the transmission/reception circuit component 10 needs to be disposed in a position not overlapping with the through-hole 88. This undesirably lowers the degree of freedom in component arrangement.

In the first embodiment, no through-hole is used to connect the radiation element 20 and the transmission/reception circuit component 10 (see FIG. 2B). Due to this, an unnecessary open stub is not formed in the transmission line. In addition, the degree of freedom in component arrangement can be prevented from being lowered.

Although, in the first embodiment, the printed dipole antenna 20A and the patch antenna 20B are used for the plurality of radiation elements 20 (see FIG. 2A), an antenna formed in another shape may be used. The radiation element 20 (see FIG. 2B) may be covered with a protective insulation layer. A passive element may be disposed on the patch antenna 20B (see FIG. 2B). Although only a phase of each input-output signal of the plurality of radiation elements 20 is controlled in the antenna-integrated type communication module according to the first embodiment, both the phase and amplitude may be controlled.

Second Embodiment

Next, the antenna-integrated type communication module 1 according to a second embodiment will be described with reference to FIG. 8A and FIG. 8B. Hereinafter, different points from the first embodiment will be described, and description of the same constituent elements will be omitted.

FIG. 8A and FIG. 8B respectively illustrate a cross-sectional view and a bottom view of the antenna-integrated type communication module 1 according to the second embodiment. In the second embodiment, the upper surface of the second dielectric layer 42 includes a flat region 46 parallel to the upper surface of the multilayer substrate 40, and a slant region 47 being slanted relative to the flat region 46. The slant region 47 is continuously connected to the flat region 46 at both ends of the flat region 46. The slant region 47 is slanted in such a direction that a normal direction 46$n$ of the flat region 46 and a normal direction 47$n$ of the slant region 47 are distanced from each other as the normal directions extend farther away from the second dielectric layer 42. Polishing to flatten the upper surface of the second dielectric layer 42 is carried out and thereafter polishing is carried out in such a manner as to perform chamfering, thereby forming the slant region 47. The plurality of patch antennas 20B are respectively disposed in the flat region 46 and the slant region 47.

In the first embodiment, the whole region of the lower surface of the multilayer substrate 40 (see FIG. 2B) is covered with the third dielectric layer 43. Meanwhile, in the second embodiment, a part of the lower surface of the multilayer substrate 40 is exposed. A receptacle 48 of a connector for a coaxial cable is mounted in the above exposed region. The receptacle 48 is connected to the transmission/reception circuit component 10 via the conductor pattern disposed inside the multilayer substrate 40.

The antenna-integrated type communication module 1 according to the first embodiment is surface-mounted on the mother board or the like of the main apparatus. On the other hand, the antenna-integrated type communication module 1 according to the second embodiment is attached to a housing of the main apparatus, and is electrically connected to the main apparatus via the coaxial cable. Through the coaxial cable, a signal in which the power supply, the local oscillation signal LO, and the intermediate frequency signal IF are superposed is transmitted.

In the second embodiment, an adaptive array antenna is configured by the plurality of patch antennas 20B disposed in the flat region 46 and the plurality of patch antennas 20B disposed in the slant region 47. The patch antenna 20B disposed in the slant region 47 has strong directivity toward a lateral side in comparison with the patch antenna 20B disposed in the flat region 46. With this, the degree of freedom in directivity adjustment of the adaptive array antenna can be increased.

In the antenna-integrated type communication module 1 of surface-mount type according to the first embodiment, the slant region 47 (see FIG. 8A) may be provided on the surface of the second dielectric layer 42 (see FIG. 2B). Further, the connector receptacle 48 for the coaxial cable (see FIGS. 8A and 8B) may be attached to the antenna-integrated type communication module 1 in which the whole region of the second dielectric layer 42 (see FIG. 2B) is flat as in the first embodiment.

It goes without saying that the above embodiments are merely examples, and that configurations described in different embodiments can partly replace each other or be combined as well. The same action effect brought by the same configuration in the plurality of embodiments is not repeatedly described in each of the embodiments. Note that the present disclosure is not limited to the above-discussed embodiments. For example, it is apparent to those skilled in the art that various kinds of modifications, improvements, combinations, and the like can be made.

1 ANTENNA-INTEGRATED TYPE COMMUNICATION MODULE
10 TRANSMISSION/RECEPTION CIRCUIT COMPONENT
11 INPUT-OUTPUT TERMINAL
12 SWITCH (TRANSMISSION/RECEPTION SWITCHING DEVICE)
13 RECEPTION LOW NOISE AMPLIFIER
14 TRANSMISSION POWER AMPLIFIER
15 PHASE SHIFTER
16 COMBINER (SIGNAL COMBINING DEVICE)
17 FREQUENCY CONVERTER
18 SPLITTER (SIGNAL SPLITTING DEVICE)
19 PHASE SHIFTER
20 RADIATION ELEMENT
20A PRINTED DIPOLE ANTENNA
20B PATCH ANTENNA
21 CONNECTION POINT
22, 23 GROUND WIRING
24 FEEDING WIRE
25 POWER SUPPLY UNIT
26 DIPLEXER
30 MAIN APPARATUS
40 MULTILAYER SUBSTRATE
41 FIRST DIELECTRIC LAYER
42 SECOND DIELECTRIC LAYER
43 THIRD DIELECTRIC LAYER
44 GROUND CONDUCTOR
45 LAND
46 FLAT REGION
46$n$ NORMAL DIRECTION OF THE FLAT REGION
47 SLANT REGION
47$n$ NORMAL DIRECTION OF THE SLANT REGION
48 RECEPTACLE OF A CONNECTOR FOR A COAXIAL CABLE
50 BAR-SHAPED MEMBER
53, 54, 55 CONDUCTOR PATTERN
56 WIRING PATTERN
57 CONDUCTOR PATTERN
58 GROUND CONDUCTOR
59 CONDUCTOR PATTERN
60, 61 LAND
70 BAR-SHAPED MEMBER
80 ANTENNA SUBSTRATE
81 THROUGH-HOLE
82 LAND
83 SOLDER
85 ANTENNA SUPPORT DIELECTRIC LAYER
86 FILLED VIA
87 ANTENNA SUPPORT DIELECTRIC LAYER
88 THROUGH-HOLE
89 CONDUCTOR PATTERN
90 CONNECTION PORTION

The invention claimed is:

1. An antenna-integrated type communication module comprising:
a multilayer substrate including a first dielectric layer and a first conductor pattern disposed at least in an interior of the first dielectric layer, the first conductor pattern transmitting a transmission signal or receiving a reception signal;
a second dielectric layer disposed on the multilayer substrate and comprising a different material from a material of the first dielectric layer;
at least one radiation element provided on the second dielectric layer;
a feeding wire connecting the at least one radiation element to the first conductor pattern,
wherein the feeding wire includes a conductor pin being conductive and extending in a thickness direction of the second dielectric layer, and the conductor pin electrically connects the at least one radiation element to the first conductor pattern, and
wherein the first dielectric layer further includes a second conductor pattern and a wiring pattern, each of the second conductor pattern and the wiring pattern is disposed in at least the interior of the first dielectric layer, and the wiring pattern horizontally connects the first conductor pattern and the second conductor pattern.

2. The antenna-integrated type communication module according to claim 1,
wherein a dielectric constant of the second dielectric layer is smaller than a dielectric constant of the first dielectric layer.

3. The antenna-integrated type communication module according to claim 1,
wherein a dielectric loss tangent of the second dielectric layer is smaller than a dielectric loss tangent of the first dielectric layer.

4. The antenna-integrated type communication module according to claim 1,
wherein one end surface of the conductor pin is in contact with an upper surface of the first conductor pattern.

5. The antenna-integrated type communication module according to claim 1,
wherein a shape and an area of a cross section, orthogonal to a lengthwise direction, of the conductor pin are constant in the lengthwise direction.

6. The antenna-integrated type communication module according to claim 1, wherein the at least one radiation element is a plurality of radiation elements,
wherein the plurality of radiation elements provide an adaptive array antenna.

7. The antenna-integrated type communication module according to claim 6,
wherein an upper surface of the second dielectric layer includes a flat region and a slant region continuously connected to the flat region, the slant region is slanted in such a direction that a normal direction of the flat region and a normal direction of the slant region are distanced from each other as the normal directions extend farther away from the second dielectric layer, and the plurality of radiation elements each acting as a patch antenna are disposed in the flat region and the slant region.

8. A manufacturing method for an antenna-integrated type communication module, the method comprising:
preparing a multilayer substrate including a first dielectric layer, a first conductor pattern disposed at least inside the first dielectric layer, and a plurality of lands disposed on an upper surface of the first dielectric layer, the first conductor pattern transmitting a transmission signal or receiving a reception signal;
bonding conductor pins onto the plurality of lands, wherein the conductor pins are served as feeding wires;
forming a second dielectric layer on the multilayer substrate in such a manner as to cover the conductor pins; and
forming radiation elements on the second dielectric layer, wherein the radiation elements are respectively connected to the plurality of conductor pins,
wherein the first dielectric layer further includes a second conductor pattern and a wiring pattern, each of the second conductor pattern and the wiring pattern is disposed at least inside the first dielectric layer, and the wiring pattern horizontally connects the first conductor pattern and the second conductor pattern.

9. The antenna-integrated type communication module according to claim 2,
wherein a dielectric loss tangent of the second dielectric layer is smaller than a dielectric loss tangent of the first dielectric layer.

10. The antenna-integrated type communication module according to claim 2,
wherein one end surface of the conductor pin is in contact with an upper surface of the first conductor pattern.

11. The antenna-integrated type communication module according to claim 3,
wherein one end surface of the conductor pin is in contact with an upper surface of the first conductor pattern.

12. The antenna-integrated type communication module according to claim 2,
wherein a shape and an area of a cross section, orthogonal to a lengthwise direction, of the conductor pin are constant in the lengthwise direction.

13. The antenna-integrated type communication module according to claim 3,
wherein a shape and an area of a cross section, orthogonal to a lengthwise direction, of the conductor pin are constant in the lengthwise direction.

14. The antenna-integrated type communication module according to claim 4,
wherein a shape and an area of a cross section, orthogonal to a lengthwise direction, of the conductor pin are constant in the lengthwise direction.

15. The antenna-integrated type communication module according to claim 2,
wherein the at least one radiation element is a plurality of radiation elements,
wherein the plurality of radiation elements provide an adaptive array antenna.

16. The antenna-integrated type communication module according to claim 3,
wherein the at least one radiation element is a plurality of radiation elements,
wherein the plurality of radiation elements provide an adaptive array antenna.

17. The antenna-integrated type communication module according to claim 4,
wherein the at least one radiation element is a plurality of radiation elements,
wherein the plurality of radiation elements provide an adaptive array antenna.

18. The antenna-integrated type communication module according to claim 5,
wherein the at least one radiation element is a plurality of radiation elements,
wherein the plurality of radiation elements provide an adaptive array antenna.

19. The antenna-integrated type communication module according to claim 1, wherein:
the multilayer substrate includes a plurality of first conductor patterns and a plurality of second conductor patterns corresponding to radiation elements disposed at least in the interior of the first dielectric layer;
a plurality of radiation elements are provided on the second dielectric layer; and
the feeding wire includes a plurality of conductor pins, each conductor pin being conductive and extending in the thickness direction of the second dielectric layer, and each of the conductor pins electrically connects each of the plurality of radiation elements to respective one of the plurality of the second conductor patterns,
wherein the first dielectric layer further includes a plurality of wiring patterns, and the plurality of wiring patterns horizontally connect the plurality of the first conductor patterns and the plurality of the second conductor patterns.

* * * * *

UNITED STATES PATENT AND TRADEMARK OFFICE
CERTIFICATE OF CORRECTION

PATENT NO. : 11,081,804 B2
APPLICATION NO. : 15/923142
DATED : August 3, 2021
INVENTOR(S) : Ryuken Mizunuma et al.

Page 1 of 1

It is certified that error appears in the above-identified patent and that said Letters Patent is hereby corrected as shown below:

In the Specification

Column 11, Line 33, "layer (see" should read -- layer 42 (see --.

Signed and Sealed this
Fifth Day of April, 2022

Drew Hirshfeld
*Performing the Functions and Duties of the*
*Under Secretary of Commerce for Intellectual Property and*
*Director of the United States Patent and Trademark Office*